United States Patent [19]
Dworsky et al.

[11] Patent Number: 5,294,898
[45] Date of Patent: Mar. 15, 1994

[54] WIDE BANDWIDTH BANDPASS FILTER COMPRISING PARALLEL CONNECTED PIEZOELECTRIC RESONATORS

[75] Inventors: Lawrence Dworsky, Scottsdale; Luke C. Bor Mang, Phoenix, both of Ariz.

[73] Assignee: Motorola, Inc., Schaumburg, Ill.

[21] Appl. No.: 827,311

[22] Filed: Jan. 29, 1992

[51] Int. Cl.$^5$ .............................................. H03H 9/58
[52] U.S. Cl. ..................................... 333/187; 333/189; 333/192; 310/320
[58] Field of Search .............................. 333/187–192; 310/320, 324, 366

[56] References Cited

U.S. PATENT DOCUMENTS

| | | | |
|---|---|---|---|
| 2,194,539 | 3/1940 | Barry et al. | 333/192 X |
| 2,429,639 | 10/1947 | McSkimin | 333/190 |
| 2,878,454 | 3/1959 | Leming et al. | 333/188 |
| 2,980,872 | 4/1961 | Storch | 333/190 |
| 3,487,318 | 12/1969 | Herman | 333/191 X |
| 3,566,313 | 2/1971 | Yuki et al. | 333/187 |
| 3,697,788 | 10/1972 | Parker et al. | 333/191 X |
| 3,838,366 | 9/1974 | Coussot | 333/192 |
| 5,034,753 | 7/1991 | Weber | 333/189 X |
| 5,057,801 | 10/1991 | Kittaka et al. | 333/187 |

OTHER PUBLICATIONS

Balloto, A., & Lukaszek T.; "A Novel Frequency Selective Device: The Stacked Crystal Filter"; *Proc 27th Ann Freq Control Syposium;* Cherry Hill, N.J.; 12–14 Jun. 1973, pp. 262-269.

Rosenbaum et al; "Design & Fabrication of Two Pole Monolithic Bulk Acoustic Filters"; *IEEE Microwave & MM Wave Circuits Syposium;* 1988, pp. 63–66.

Lakin et al; "Stacked Crystal Filters Implemented with Thin Films"; *IEEE Symposium on Freq Control;* Jun. 1989; pp. 536-543.

Dworsky, L.; "A Comparison of Band Pass Filter Technologies for Communication Systems"; *IEEE Ultrasonic Syposium;* 5 Dec. 1991.

*Primary Examiner*—Benny Lee
*Attorney, Agent, or Firm*—Robert F. Hightower; Joe E. Barbee

[57] ABSTRACT

A plurality of piezoelectric resonators (10,32,37,57,62,66,79,88,93) are utilized to form a bandpass filter (31,56,78). The resonators (10,32,37,57,62,66,79,88,93) are connected in parallel to form a plurality of parallel paths between an input (43,73,81) and an output (47,74,82) of the filter (31,56,78). A predetermined number of the piezoelectric resonators (10,32,37,57,62,66,79,88,93) provide a phase shift of approximately 180 degrees. Each parallel path has a passband and center frequency that is displaced from the passband and center frequency of other paths. Consequently, the passband of each parallel path algebraically sums and creates a filter passband that is wider than the passband of each of the filter's individual parallel paths.

18 Claims, 3 Drawing Sheets

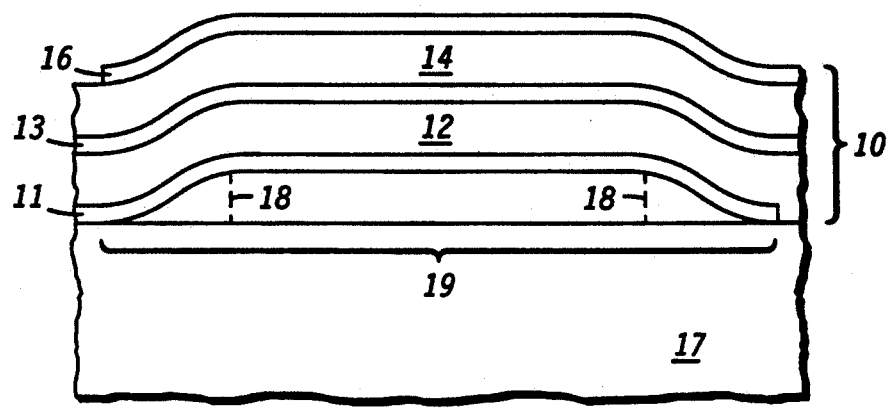
FIG. 1
FIG. 2
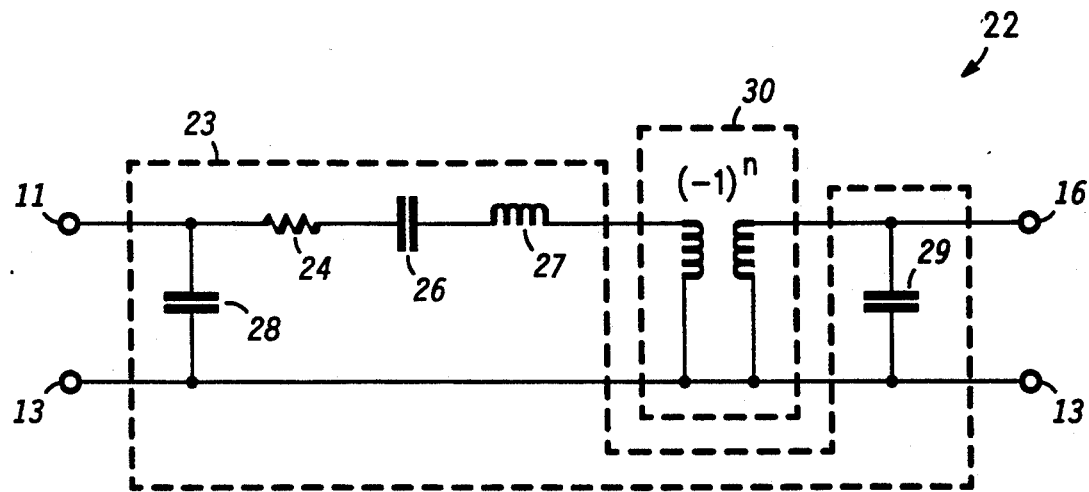

WIDE BANDWIDTH BANDPASS FILTER COMPRISING PARALLEL CONNECTED PIEZOELECTRIC RESONATORS

BACKGROUND OF THE INVENTION

The present invention relates, in general, to filters for electronic circuits, and more particularly, to a novel filter that utilizes piezoelectric resonators.

In the past, piezoelectric resonators have been used to replace electromagnetic filter elements in electronic circuits. Some implementations of these piezoelectric resonators include surface acoustic wave resonators and thin film bulk wave resonators. In order to obtain good frequency rejection, thin film bulk wave resonators generally are formed as a stacked piezoelectric resonator, and are most often composed of a multi-layer structure that has two piezoelectric films alternately positioned between three metal electrodes.

Bandpass filters that utilize stacked piezoelectric resonators generally have a narrow passband or range of frequencies that pass through the resonator. The passband's maximum width, or bandwidth, often is less than two percent of the passband's center frequency. Many communication applications require filters with a passband that has a high center frequency and a bandwidth that is in excess of two percent of the center frequency.

Accordingly, it is desirable to have a bandpass filter that has a passband which is greater than approximately two percent of the passband's center frequency.

SUMMARY OF THE INVENTION

Briefly stated, the present invention provides a bandpass filter that utilizes a plurality of piezoelectric resonators. The resonators are connected in parallel between an input and an output of the filter. A predetermined number of the piezoelectric resonators provide a phase shift of approximately 180 degrees. The phase shift facilitates forming a wide bandwidth for the bandpass filter.

BRIEF DESCRIPTION OF THE DRAWINGS

FIG. 1 illustrates an enlarged cross-sectional view of a stacked piezoelectric resonator in accordance with the present invention;

FIG. 2 is an equivalent circuit schematic of the stacked piezoelectric resonator of FIG. 1;

DETAILED DESCRIPTION OF THE DRAWINGS

Figure 3:
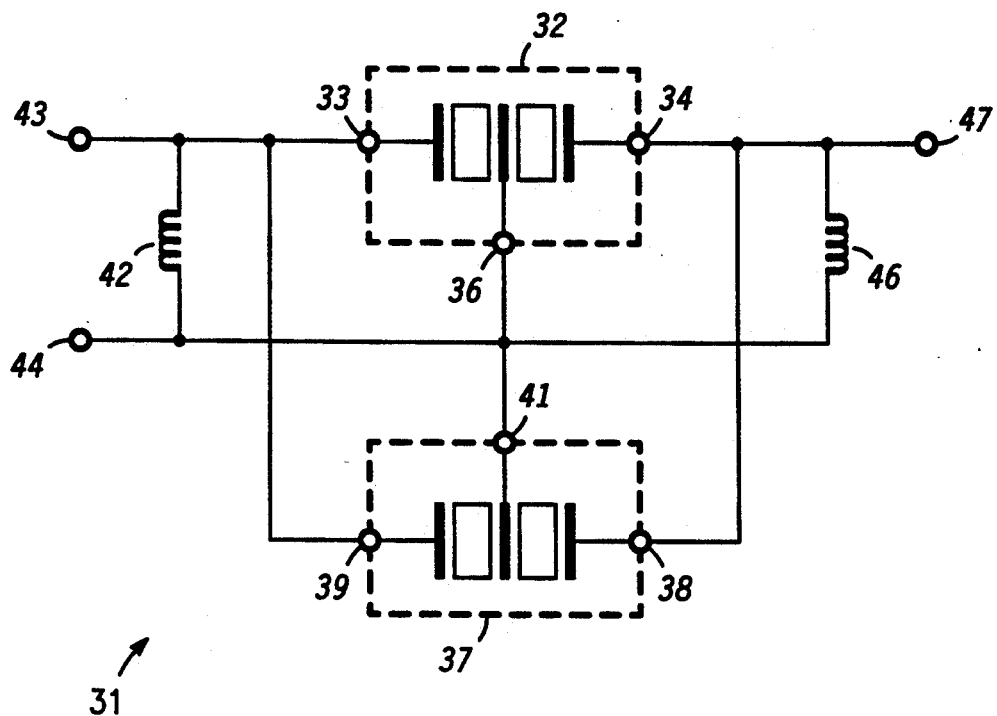
FIG. 3 is a schematic representation of a bandpass filter employing the resonator of FIG. 1.

FIG. 1 illustrates an embodiment of a stacked piezoelectric resonator 10 that facilitates forming a bandpass filter. Resonator 10 includes a first electrode 11, a piezoelectric layer 12, a center or common electrode 13, a second piezoelectric layer 14, and a third electrode 16. In the preferred embodiment, resonator 10 is formed on a semiconductor substrate 17 that is suitable for forming passive and active components that can be electrically coupled to resonator 10. Such a resonator structure can be easily integrated on semiconductor substrate 17 along with inductors and capacitors that may be required by a complete filter as will be seen hereinafter. A variety of Group II and Group VI elements can be combined to form suitable compounds for layers 12 and 14. Such compounds, by chemical abbreviation, include, but are not limited to, AlN, CdS, ZnS, LiNbO$_3$, LiTaO$_3$, B$_{12}$GeO$_{20}$, PZT, B$_{12}$PbO$_{19}$, PLZT, K$_3$Li$_2$Nb$_5$O$_{15}$, Bi$_4$Ti$_3$O$_{12}$. In the preferred embodiment, layers 12 and 14 are zinc oxide (ZnO), and each electrode 11, 13, and 16 is formed by successive depositions of titanium (Ti), tungsten (W), and aluminum (Al).

An active area of resonator 10 is formed by the region where electrode 16 overlaps electrode 11 as shown by a length 19. The active area's width is determined by the width of the overlapping portion of electrodes 11 and 16. As shown in FIG. 1, the width is the dimension normal to the plane of FIG. 1. As will be seen hereinafter, these dimensions assist in determining the operating frequency of resonator 10.

As is well known in the art, electrical signals applied to a stacked piezoelectric resonator, such as resonator 10, cause the resonator to mechanically deform or vibrate. The vibration creates an acoustic wave through the device which determines the electrical properties of the resonator. In general, resonator 10 has a resonance at fundamental frequency ($f_0$) that is determined by the properties of the materials used to implement resonator 10 and by the dimensions of resonator 10. An equation 21 can be used to substantially determine $f_0$ as shown below:

$$f_0 = \frac{1}{2\sqrt{d}} \sqrt{\frac{P}{h^2} + M\left(\frac{1}{L^2} + \frac{1}{W^2}\right)} \quad (21)$$

where;
P = appropriate elastic constant of extension,
M = appropriate elastic constant of shear,
h = total resonator thickness,
L = length of the active area, such as dimension 19 as seen in FIG. 1,
W = width of the active area, and
d = mass density of the piezoelectric material.

P, M, and d are constants that are well known to those skilled in the art, and are determined by the material used for layers 12 and 14. Thus, the fundamental frequency $f_0$ is primarily determined by the thickness or height (h), and the size of the active area (L and W).

As discussed hereinbefore, resonator 10 must have surfaces that are free to vibrate. One method of creating these free surfaces is to form a gap that suspends a portion of resonator above substrate 17. To form the gap, resonator 10 is formed on a base or mesa (illustrated by dashed lines 18) which will subsequently be removed thereby leaving the gap between resonator 10 and substrate 17. As will be shown hereinafter, it is important that the base's width be greater than the width of any layer of resonator 10 in order to provide a means to subsequently remove the base. Once the base is formed, electrode 11 is deposited covering the base and a portion of substrate 17. Then, first piezoelectric layer 12 is deposited on electrode 11, common electrode 13 is deposited on layer 12, second piezoelectric layer 14 is deposited on electrode 13, and third electrode 16 is deposited on second piezoelectric layer 14. After the different layers of resonator 10 have been formed, the base, represented by dashed lines 18, is removed leaving the gap that suspends a portion of resonator 10 and permits resonator 10 to vibrate without touching substrate 17. In the preferred embodiment, the base is formed from aluminum (Al) which can be dissolved without affecting substrate 17, layers 12 and 14, or electrodes 11, 13, and 16.

It will be apparent to those skilled in the art that a variety of other manufacturing techniques may be employed to form a stacked piezoelectric resonator, such as resonator 10, and that these techniques may yield slightly different configurations although these configurations will have three electrodes. In addition, a resonator, such as resonator 10, could be formed on a variety of substrates or the substrate can be removed to leave an individual resonator.

FIG. 2 illustrates the equivalent electrical circuit 22 of resonator 10 from FIG. 1. Elements of FIG. 2 that are the same as FIG. 1 have the same reference numerals. A base circuit 23 represents the traditionally accepted equivalent circuit of a stacked piezoelectric resonator, such as resonator 10 from FIG. 1, and is well known to those skilled in the art. Base circuit 23 includes an input 11, an output 16, and a common electrode 13 which represent electrodes 11, 16, and 13 respectively of FIG. 1. An input capacitor 28 and an output capacitor 29 represent the parallel plate or static capacitance created from the configuration of a piezoelectric layer between two electrodes. Layer 12 and electrodes 11 and 13 (FIG. 1) substantially form capacitor 28, while layer 14 and electrodes 16 and 13 (FIG. 1) substantially form capacitor 29. The series connected resistor 24, capacitor 26, and inductor 27 represent the electrical analogs resulting from the vibration of resonator 10 (FIG. 1). These are often referred to as the motion arm components of base circuit 23.

Base circuit 23 provides an equivalent circuit that emulates the electrical response of resonator 10 (of FIG. 1) to an electrical signal at the fundamental frequency $f_0$ as defined by equation 21. At frequency $f_0$, circuit 23 presents a minimum impedance that passes frequency $f_0$ and other nearby frequencies in the resonator's passband (typically plus or minus 2% of $f_0$) with minimal attenuation. At overtone frequencies $f_n$ (multiples of fundamental frequency $f_0$), base circuit 23 also provides minimal attenuation. It has been found that at odd overtones ($f_1$, $f_3$, etc.) resonator 10 of FIG. 1 shifts the phase of the applied signal by approximately 180°. Consequently, a phase inversion circuit 30 has been added to account for the phase shift. Phase inversion circuit 30 includes a transformer having coupling ratio of $(-1)^n$ where the superscript n is the same number as the subscript n for overtone frequency $f_n$. Thus, the transformer provides a phase shift of approximately 180° for signals that are odd overtones of the fundamental frequency. As will be seen hereinafter, the phase shift, provided by resonator 10 of FIG. 1 and represented by circuit 30, facilitates implementing a filter having a wide passband.

FIG. 3 is a schematic illustration of a bandpass filter 31 which utilizes a stacked piezoelectric resonator 32 that is connected in parallel with a stacked piezoelectric resonator 37 in order to provide a wide bandpass filter. Resonators 32 and 37 are formed similarly to resonator 10 of FIG. 1. Resonator 32 is formed to provide a fundamental frequency $f_0$ as determined by equation 21. An input 33, an output 34, and common electrode 36 of resonator 32 correspond to electrodes 11, 16, and 13 respectively of FIG. 1. Filter 31 has an input terminal 43 that is connected to input 33 of resonator 32, and also has an output terminal 47 that is connected to output 34 of resonator 32. A common terminal 44 of filter 31 is connected to common electrode 36 of resonator 32 and to a common electrode 41 of resonator 37. Resonator 37 also has an input 39 connected to input terminal 43, and an output 38 connected to output terminal 47. Resonator 37 is formed to have a first overtone frequency $f_1$ that is displaced, either above or below fundamental frequency $f_0$, by a predetermined percent of the fundamental frequency $f_0$. The displacement is within a range that allows the passband of resonator 32 to overlap a portion of the passband of resonator 37. Since the passband of each individual resonator 32 and 37 is narrow (approximately 2% of the resonator's center frequency), it is preferable to have a small separation between $f_0$ and $f_1$. It has been found that a separation of approximately three to four percent generally provides the desired passband overlap. In the preferred embodiment, $f_1$ is within approximately three percent of $f_0$ (3% displacement). Since resonator 37 is operating at an odd overtone frequency and provides a phase shift, the two overlapping passbands algebraically sum to create a composite passband for filter 31 that is larger than the passband of either resonator 32 or 37 separately. Therefore, both $f_0$ and $f_1$ are within the composite passband of filter 31. This is further discussed in FIG. 4.

An input inductor 42 is provided to tune out the static input capacitance of resonators 32 and 37 (represented by capacitor 28 of FIG. 2) thereby preventing the static input capacitance from affecting the passband of filter 31. Inductor 42 has a first terminal connected to input terminal 43, and a second terminal connected to common terminal 44. In a similar manner, an output inductor 46 has a first terminal connected to output terminal 47 and a second terminal connected to common node 44 in order to tune out the static output capacitance of resonators 32 and 37 (represented by capacitor 29 of FIG. 2). Therefore, the response of filter 31 is dominated by the motion arm components of resonators 32 and 37 that is, by the series connected resistor, capacitor, and inductor that represent the electrical analog of the vibration as discussed in FIG. 2. In the preferred embodiment, both inductors 42 and 46 are integrated onto a semiconductor device along with resonators 32 and 37. Such integrated inductors are well known in the semiconductor art as illustrated by Joel Rosenbaum et al., "Design and Fabrication of Two-Pole Monolithic Bulk Acoustic Filters", *IEEE Microwave and Millimeter-Wave Circuits Symposium*, 1988, pp. 63–66 which is hereby incorporated herein by reference.

Figure 4:
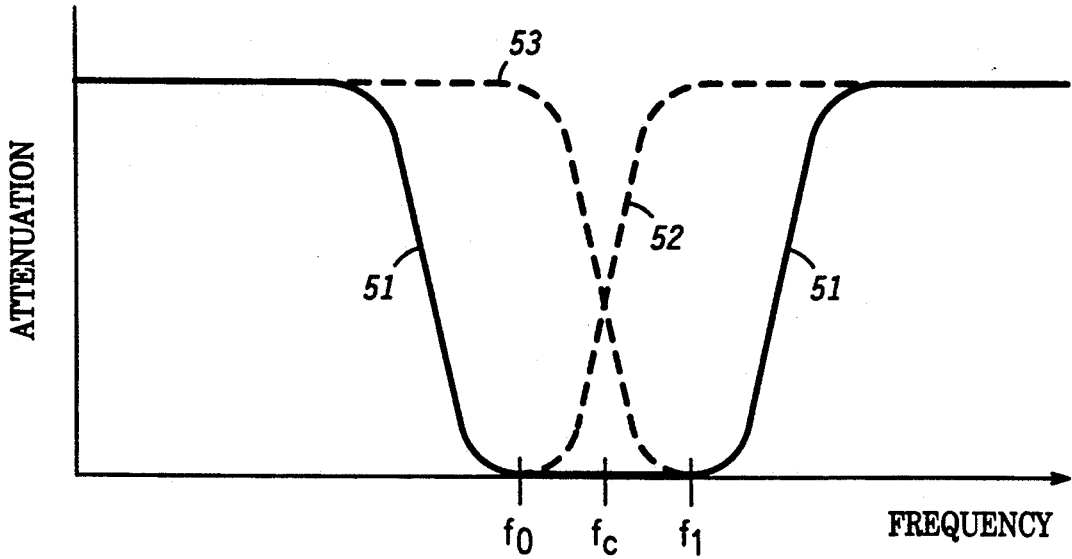
FIG. 4 is a graph representing the response of the filter of FIG. 3.

FIG. 4 is a graph illustrating the attenuation provided by filter 31 (of FIG. 3) over a range of frequencies as represented by a plot 51 (solid line). The ordinate represents attenuation and frequency is shown on the abscissa. A plot 52 represents the response provided by resonator 32 of FIG. 3 and shows that resonator 32 has a passband that is centered to fundamental frequency $f_0$. Plot 52 includes a low frequency portion, shown by the portion of plot 51 that is below frequency $f_0$, and a high frequency portion as shown by the dashed line portion of plot 52. A plot 53 represents the response provided by resonator 37 (of FIG. 3) and includes a low frequency portion shown by the dashed portion of plot 53 that is below first overtone frequency $f_1$, and a high frequency portion shown by the portion of plot 51 that is higher than $f_1$. Plot 53 illustrates that resonator 37 has a passband which is centered to $f_1$ and is displaced from $f_0$ by a predetermined amount. Note that $f_1$ is shown as higher in frequency than $f_0$, but could also be lower. The phase shift provided by resonator 37 of FIG. 3 causes plots 52 and 53 to algebraically sum thereby providing a passband for filter 31 (plot 51) that is wider than the passband of resonator 32 (plot 52) or resonator 37 (plot 53). The center frequency of filter 31 (FIG. 3) is shown by $f_c$.

The wide passband that is provided by filter 31 of FIG. 3 is a significant improvement over the passband of prior filters that utilized piezoelectric resonators, and will pass a much wider range of frequencies than the prior filters.

Figure 5:
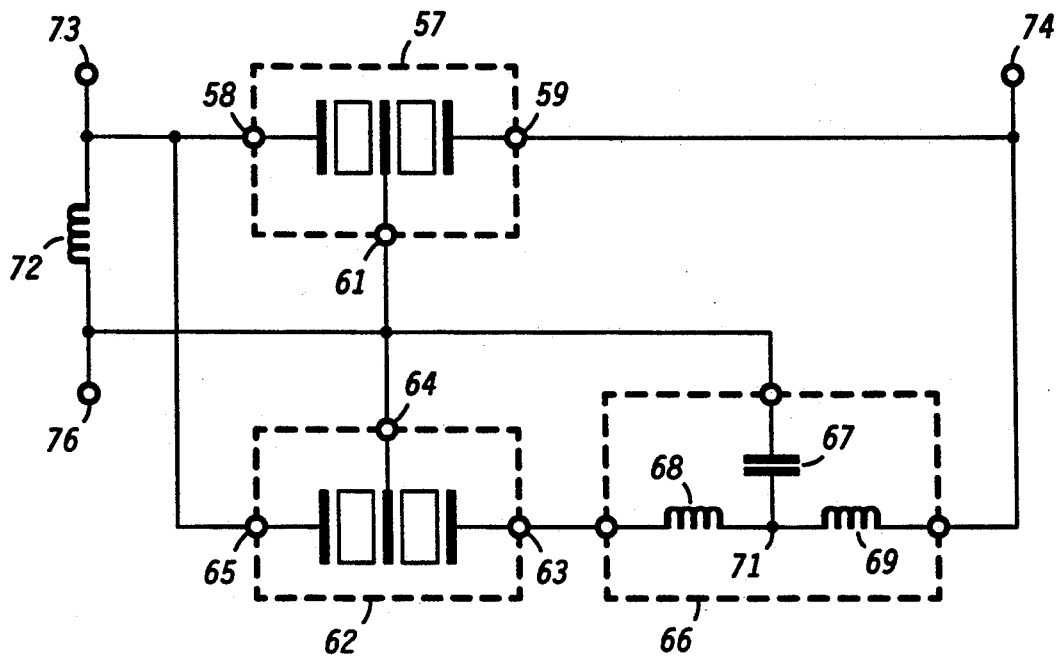
FIG. 5 illustrates another embodiment of a bandpass filter in accordance with the present invention.

FIG. 5 schematically illustrates an embodiment of a bandpass filter 56 which includes a stacked piezoelectric resonator 57 and a stacked piezoelectric resonator 62. As shown by equation 21, the frequency of stacked piezoelectric resonators can be easily changed by varying the height, or the area of the resonator. For filters that employ a fundamental and a first overtone resonator, such as filter 31 of FIG. 3, the first overtone resonator may be substantially larger than the fundamental resonator. When implemented as part of an integrated semiconductor device, it may be desirable to have both resonators of similar size. Filter 56 provides a circuit that is suitable for employing similar sized resonators. Resonators 57 and 62 are each formed to have different fundamental frequencies that are within the desired passband of filter 56, with each of the fundamental frequencies separated by a predetermined amount similar to the separation of resonators 32 and 37 of FIG. 3. Since both resonators 57 and 62 operate at a fundamental frequency, neither provides a phase shift. Consequently, a phase shift network 66 is placed in series with resonator 62 in order to create the phase shift required to provide a summation of the passbands of resonators 57 and 62 (similar to the summation provided by filter 31 of FIG. 3). It will be noted that network 66 could alternately be placed in series with resonator 57. Resonator 57 has an input 58 that is connected to an input terminal 73 of filter 56, and an output 59 which is connected to an output terminal 74 of filter 56. A common electrode 61 of resonator 57 is connected to a common terminal 76 of filter 56. Resonator 62 has an input 65 that is connected to input terminal 73, and a common electrode 64 that is connected to common terminal 76. Phase shift network 66 includes an input inductor 68 that has a first terminal connected to an output 63 of resonator 62, and a second terminal connected to a phase shift common node 71. An output inductor 69 of phase shift network 66 has a first terminal connected to phase shift common node 71 and a second terminal connected to output terminal 74 of filter 56. Inductor 69 also functions to cancel the static output capacitance of resonators 57 and 62. A phase shift capacitor 67 has a first terminal connected to node 71 and a second terminal connected to a common terminal 76 of filter 56. The first terminal of inductor 68 functions as a phase shift input, the second terminal of inductor 69 functions as a phase shift output, and a phase shift common electrode is formed by the second terminal of capacitor 67.

An input inductor 72 is used to cancel the static input capacitance of resonators 57 and 62, and has a first terminal connected to input terminal 73 and a second terminal connected to common terminal 76. In the preferred embodiment, capacitor 67 and inductors 68, 69, and 72 are integrated onto a semiconductor device along with resonators 57 and 62 in a manner similar to inductors 42 and 46 of FIG. 3.

The passband of filter 56 has a bandwidth that is greater than 4% of the filter's center frequency. This wide passband is a significant improvement over prior bandpass filters that utilized piezoelectric resonators.

Figure 6:
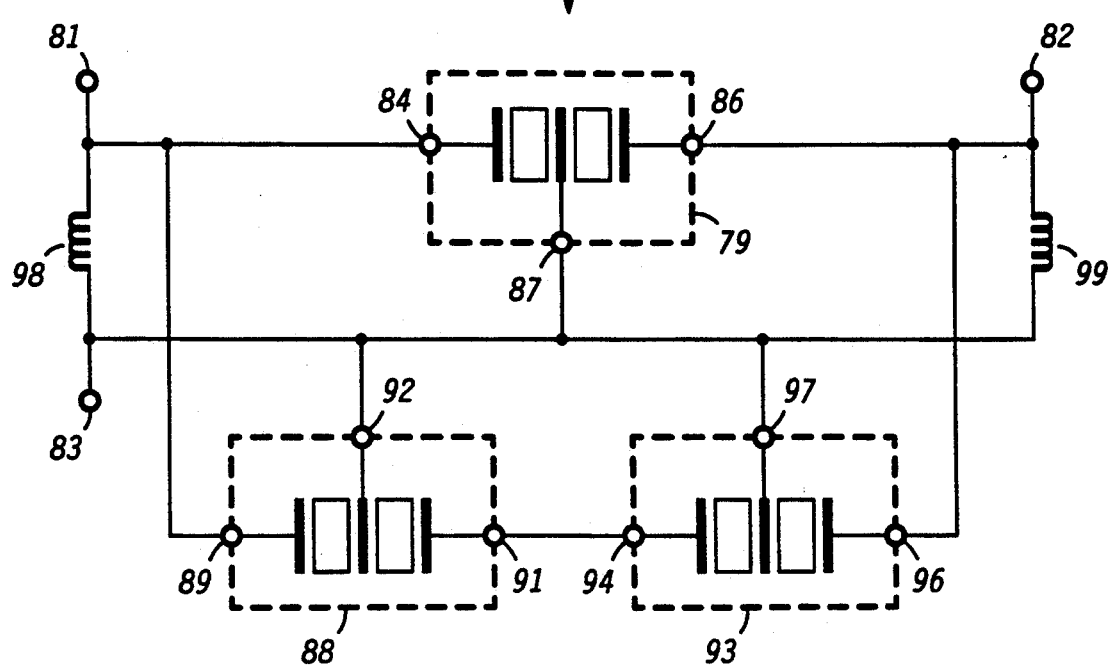
FIG. 6 represents a further embodiment of a bandpass filter in accordance with the present invention.

FIG. 6 illustrates an embodiment of a bandpass filter 78 that also has a wide bandwidth. Filter 78 includes a piezoelectric resonator 79 which is connected in parallel with the series connected combination of a piezoelectric resonator 88 and a piezoelectric resonator 93. Resonators 79, 88, and 93 are each formed to have a first overtone frequency that is within the passband of filter 78, thus, each of resonators 79, 88, and 93 provide a phase shift of approximately 180 degrees. Series connected resonators 88 and 93 combined provide a 360 degree phase shift for a net equivalent zero phase shift (no phase shift). The 180 degree phase shift that is required to widen the passband of filter 78 is provided by resonator 79. Consequently, filter 78 functions similarly to filter 31 of FIG. 3. Since the first overtone frequency of resonators 79, 88, and 93 are similar, the resonators also have approximately similar sizes, and can be easily integrated onto a semiconductor chip along with other passive and active components.

Filter 78 has an input terminal 81 which is connected to an input 84 of resonator 79, an input 89 of resonator 88, and a first terminal of an input inductor 98. Input inductor 98 is provided to substantially cancel the static input capacitance of resonators 79 and 88. Similarly, an output inductor 99 substantially cancels the static output capacitance of resonators 79 and 93. Filter 78 also has an output terminal 82 which is connected to an output 86 of resonator 79, an output 96 of resonator 93, and a first terminal of output inductor 99. A common terminal 83 of filter 78 is connected to a common electrode 92 of resonator 88, a common electrode 97 of resonator 93, a common electrode 87 of resonator 79, a second terminal of inductor 98, and a second terminal of inductor 99. Resonator 88 has an output 91 that is connected to an input 94 of resonator 93. In the preferred embodiment, inductors 98 and 99 are integrated onto a semiconductor device along with resonators 79, 88, and 93 in a manner similar to inductors 42 and 46 of FIG. 3.

The technique of connecting piezoelectric resonators in parallel to provide a wide passband can be extended beyond filters having two parallel paths. For a filter having a plurality of parallel connected piezoelectric resonators, a predetermined number of the parallel paths, for example alternate parallel paths, should provide a phase shift and each parallel path should also have a center frequency that is displaced a predetermined incremental amount from the center frequency of other paths. In the preferred embodiment, the parallel paths have monotonically arranged resonance frequencies. Each parallel resonator of such a configuration extends the filter's bandwidth by this predetermined incremental amount. In addition, the parallel paths that provide the phase shift are not restricted to the first overtone, but can operate at any odd overtone frequency that is within the passband of the filter. It should also be noted that such a technique is not limited to stacked piezoelectric resonators, but also applies to surface acoustic wave piezoelectric resonators. Additionally, it should also be noted that a simple two terminal piezoelectric resonator does not provide a phase shift, and that such a two terminal resonator can be employed in parallel with odd overtone resonators to form a wide bandpass filter. Simple two terminal piezoelectric resonators are well known in the art.

By way of example, an 800 MHz bandpass filter is configured as shown by filter 78 of FIG. 6. The filter incorporates resonators formed as illustrated by resonator 10 of FIG. 1. A first resonator, such as resonator 79 of FIG. 6, is formed approximately 3 microns thick in order to have a first overtone frequency at approximately 788 MHz. The equivalent circuit of the first resonator has a static input capacitor and a static output capacitor which each have a value between approximately 1 picofarad (pf) and 2 pf, a motion arm inductor value of approximately 0.67 microhenries, a motion arm resistor value between approximately 1 and 2 ohms, and a motion arm capacitor value that is approximately 1/50 the static input capacitance value. The resulting passband of the first resonator is approximately 15 MHz wide (approximately 1.9% of 788 MHz). A second and a third resonator, such as resonators 88 and 93 respectively of FIG. 6, are each formed to have a first overtone frequency of approximately 812 MHz or approximately 3% greater than the first overtone frequency of the first resonator. To achieve this 3% increase, the second and third resonators are constructed to have a height or thickness that is approximately 3% less than first resonator. Correspondingly, the equivalent electrical components of the second and third resonators are each approximately 3% smaller than the corresponding components of the first resonator. The passband of each of the second and third resonators has a width of approximately 16 MHz (approximately 1.97% of 812 MHz).

The filter also includes an input inductor, representing inductor 98 of FIG. 6, and an output inductor, such as inductor 99 of FIG. 6. The output and input inductors each have a value that is approximately one fiftieth (1/50) of the series inductance of the largest resonator ((1/50)*(0.67 microhenries)*(0.03) or approximately 0.4 nanohenries).

This combination provides a filter having a center frequency of approximately 800 MHz and a passband that is greater than approximately 40 MHz. Consequently, the filter's passband is greater than approximately five percent (5%) of the filter's 800 MHz center frequency. This passband width is significantly greater than prior filters that employed piezoelectric resonators, and is particularly useful for filters having a center frequency near and greater than 800 MHz.

By now it should be appreciated that there has been provided a novel way to fabricate a bandpass filter that has a wide passband. By forming a plurality of parallel connected piezoelectric resonators that each have passbands that are displaced by a predetermined amount, the filter's passband can be extended at least by the predetermined amount. Such a technique permits forming high frequency wide bandwidth filters on integrated circuits along with other passive and active components. These filters can be used in a variety of high frequency applications such as cellular telephone, mobile radio communication, and other applications where wide bandwidth and high frequency operation are required.

We claim:

1. A wide bandwidth bandpass filter comprising:
   an input inductor having a first terminal coupled to an input terminal of the bandpass filter, and a second terminal coupled to a common terminal of the bandpass filter;
   an output inductor having a first terminal coupled to an output terminal of the bandpass filter, and a second terminal coupled to the common terminal of the bandpass filter;
   a first stacked piezoelectric resonator having a first input coupled to the input terminal, a first output coupled to the output terminal, and a first common electrode coupled to the common terminal wherein the first stacked piezoelectric resonator has a first odd overtone frequency that is within a passband of the bandpass filter;
   a second stacked piezoelectric resonator having a second input coupled to the input terminal, a second output, and a second common electrode coupled to the common terminal wherein the second stacked piezoelectric resonator has a second odd overtone frequency that is displaced from the first odd overtone frequency; and
   a third stacked piezoelectric resonator having a third input coupled to the second output of the second piezoelectric resonator, a third output coupled to the output terminal, and a third common electrode coupled to the common terminal wherein the third stacked piezoelectric resonator has a third odd overtone frequency that is substantially equal to the second odd overtone frequency.

2. The bandpass filter of claim 1 wherein the second odd overtone frequency is displaced from the first odd overtone frequency by at least three percent (3%).

3. The bandpass filter of claim 1 wherein the first stacked piezoelectric resonator includes a first electrode that is coupled to the first input, a first piezoelectric layer on the first electrode, a second electrode on the first piezoelectric layer wherein the second electrode is coupled to the first common electrode, a second piezoelectric layer on the second electrode, and a third electrode on the second piezoelectric layer wherein the third electrode is coupled to the second output.

4. The bandpass filter of claim 3 wherein the second stacked piezoelectric resonator includes a fourth electrode that is coupled to the second input, a third piezoelectric layer on the fourth electrode, a fifth electrode on the third piezoelectric layer wherein the fifth electrode is coupled to the second common electrode, a fourth piezoelectric layer on the fifth electrode, and a sixth electrode on the fourth piezoelectric layer wherein the sixth electrode is coupled to the second output; and the third stacked piezoelectric resonator includes a seventh electrode that is coupled to the third input, a fifth piezoelectric layer on the seventh electrode, an eighth electrode on the fifth piezoelectric layer wherein the eighth electrode is coupled to the third common electrode, a sixth piezoelectric layer on the eighth electrode, and a ninth electrode on the sixth piezoelectric layer wherein the ninth electrode is coupled to the third output.

5. The bandpass filter of claim 1 wherein the first stacked piezoelectric resonator, the second stacked piezoelectric resonator, and the third stacked piezoelectric resonator are disposed on a semiconductor substrate.

6. The bandpass filter of claim 1 wherein the passband of the bandpass filter is greater than approximately three percent of a center frequency of the bandpass filter.

7. The bandpass filter of claim 6 wherein the center frequency of the bandpass filter is at least 800 MHz.

8. A bandpass filter comprising:

an input terminal;
an output terminal;
a common terminal;
a first stacked piezoelectric resonator having a first input coupled to the input terminal, a first output coupled to the output terminal, and a first common electrode coupled to the common terminal; and
a second stacked piezoelectric resonator having a second input coupled to the input terminal, a second common electrode coupled to the common terminal, and a second output coupled to the output terminal, wherein the bandpass filter has a passband.

9. A bandpass filter comprising:
an input terminal;
an output terminal;
a common terminal;
a first piezoelectric resonator having a first input coupled to the input terminal, a first output coupled to the output terminal, and a first common electrode coupled to the common terminal wherein the first piezoelectic resonator has a fundamental frequency that is within a passband of the bandpass filter; and
a second piezoelectric resonator having a second input coupled to the input terminal, a second common electrode coupled to the common terminal, and a second output coupled to the output terminal wherein the second piezoelectric resonator has an odd overtone frequency that is within a percentage value of the fundamental frequency.

10. The bandpass filter of claim 9 wherein the percentage value is at least three percent (3%).

11. A bandpass filter comprising:
an input terminal;
an output terminal;
a common terminal;
a first piezoelectric resonator having a first input coupled to the input terminal, a first output coupled to the output terminal, and a first common electrode coupled to the common terminal;
a second piezoelectric resonator having a second input coupled to the input terminal and and a second output; and
a phase shift network having a first terminal coupled to the second output of the second piezoelectric resonator and a second terminal coupled to the output terminal wherein the phase shift network provides a phase shift of approximately one hundred eighty degrees (180°) and wherein the first piezoelectric resonator has a first fundamental frequency that is within a passband of the bandpass filter and the second piezoelectric resonator has a second fundamental frequency that is within a percentage value of the first fundamental frequency.

12. The bandpass filter of claim 11 wherein the phase shift network further includes a phase shift common electrode coupled to the common terminal.

13. A bandpass filter comprising:
an input terminal;
an output terminal;
a common terminal;
a first piezoelectric resonator having a first input coupled to the input terminal, a first output coupled to the output terminal, and a first common electrode coupled to the common terminal;
a second piezoelectric resonator having a second input coupled to the input terminal, a second common electrode coupled to the common terminal, and a second output; and
a third piezoelectric resonator having a third input coupled to the second output of the second piezoelectric resonator, a third output coupled to the output terminal, and a third common electrode coupled to the common terminal.

14. The bandpass filter of claim 13 wherein the first piezoelectric resonator, the second piezoelectric resonator, and the third piezoelectric resonator are each a stacked piezoelectric resonator.

15. The bandpass filter of claim 13 wherein the first piezoelectric resonator has a first odd overtone frequency that is within the passband of the bandpass filter, the second piezoelectric resonator has a second odd overtone frequency that is within a percentage value of the first odd overtone frequency, and the third piezoelectric resonator has a third odd overtone frequency that is substantially equal to the second odd overtone frequency.

16. A method of forming a wide bandwidth bandpass filter comprising:
coupling a plurality of piezoelectric resonators in parallel between an input terminal of the filter and an output terminal of the filter and having at least one piezoelectric resonator of the plurality of piezoelectric resonators creating a phase shift of approximately one hundred eighty degrees (180°).

17. The method of claim 16 wherein coupling the plurality of piezoelectric resonators includes coupling a plurality of stacked piezoelectric resonators.

18. The method of claim 16 wherein the coupling the plurality of piezoelectric resonators step includes providing the plurality of piezoelectric resonators with each piezoelectric resonator having a passband that is substantially centered to a different frequency.

* * * * *